US007732763B2

(12) United States Patent
Motoki

(10) Patent No.: US 7,732,763 B2
(45) Date of Patent: Jun. 8, 2010

(54) PATTERN INSPECTION METHOD, PATTERN INSPECTION APPARATUS, SEMICONDUCTOR DEVICE MANUFACTURING METHOD, AND PROGRAM

(75) Inventor: Hiroshi Motoki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 11/703,669

(22) Filed: Feb. 8, 2007

(65) Prior Publication Data
US 2007/0194233 A1 Aug. 23, 2007

(30) Foreign Application Priority Data
Feb. 9, 2006 (JP) ............................. 2006-032433

(51) Int. Cl.
H01J 37/26 (2006.01)
(52) U.S. Cl. ................. 250/310; 250/491.1; 250/492.1; 250/492.2; 250/492.3; 250/306; 250/307; 250/309; 250/311
(58) Field of Classification Search ................. 250/306, 250/307, 309, 310, 311, 491.1, 492.2, 492.21, 250/492.3, 492.1, 492.22, 492.23, 492.24; 382/144, 172; 430/296, 297, 298
See application file for complete search history.

(56) References Cited

U.S. PATENT DOCUMENTS

| 6,952,105 | B2 | 10/2005 | Cheng et al. |
| 7,375,328 | B2 * | 5/2008 | Yonezawa et al. ............ 250/310 |
| 2002/0171051 | A1 * | 11/2002 | Nakagaki et al. ......... 250/559.4 |
| 2003/0183762 | A1 * | 10/2003 | Nagaoki et al. ............. 250/307 |
| 2005/0199808 | A1 * | 9/2005 | Obara et al. ................ 250/310 |
| 2006/0039596 | A1 | 2/2006 | Nojima et al. |
| 2006/0097158 | A1 * | 5/2006 | Yamaguchi et al. ......... 250/307 |
| 2008/0302963 | A1 * | 12/2008 | Nakasuji et al. ............. 250/310 |
| 2009/0230303 | A1 * | 9/2009 | Teshima et al. ............. 250/310 |

* cited by examiner

Primary Examiner—Jack I Berman
Assistant Examiner—Nicole Ippolito Rausch
(74) Attorney, Agent, or Firm—Finnegan, Henderson, Farabow, Garrett & Dunner, L.L.P.

(57) ABSTRACT

A pattern inspection method includes: irradiating a first region of a surface of a sample having a pattern to be inspected with a charged particle beam; acquiring a first two-dimensional image showing a state of the surface of the sample; searching for a pattern similar to a previously prepared reference image within the first two-dimensional image; when the pattern similar to the reference image is not detected in the first two-dimensional image, irradiating a second region of the surface of the sample that has not been irradiated with a charged particle beam; acquiring a second two-dimensional image showing a state of the surface of the sample; and searching a pattern similar to the reference image within the second two-dimensional image.

12 Claims, 3 Drawing Sheets

PATTERN INSPECTION METHOD, PATTERN INSPECTION APPARATUS, SEMICONDUCTOR DEVICE MANUFACTURING METHOD, AND PROGRAM

CROSS REFERENCE TO RELATED APPLICATION

This application claims benefit of priority under 35USC §119 to Japanese patent application No. 2006-032433, filed on Feb. 9, 2006, the contents of which are incorporated by reference herein.

BACKGROUND OF THE INVENTION

1. Field of the Invention

The present invention relates to a pattern inspection method, a pattern inspection apparatus, a semiconductor device manufacturing method, and a program, and is directed to the measurement and inspection of, for example, a semiconductor pattern using a charged particle beam.

2. Related Background Art

When a semiconductor pattern is automatically measured using a scanning electron microscope, automatic focusing processing or pattern recognition processing, for example, may fail in the middle of the measurement, so that a measurement value results in an abnormal value. In such a case, if the measurement is judged to be an error and remeasurement is automatically carried out when the measurement value exceeds a certain range, the automatic measurement can be continued without troubling an operator.

However, if a measurement point where the measurement error has occurred is remeasured as it is, the measurement point is irradiated with the electron beam twice, which is a significant problem in the case of measuring a pattern made of a material greatly damaged (volume shrinkage due to the desorption of a protecting group) by the irradiation of the electron beam such as a resist for ArF excimer laser exposure devices or a low-k material. Moreover, even in the case of a material which is not damaged by the irradiation of the electron beam, the shape of the pattern changes due to a contrast change caused by a charge-up and contamination caused by the irradiation of the electron beam, so that it is impossible to accurately measure the pattern.

SUMMARY OF THE INVENTION

According to a first aspect of the present invention, there is provided a pattern inspection method comprising:

generating a charged particle beam to irradiate the charged particle beam to a sample having a surface on which a pattern to be inspected is formed;

detecting at least one of a secondary charged particle, a reflection charged particle and a back scattering charged particle emitted from the sample due to the irradiation of the charged particle beam, and acquiring a first two-dimensional image showing a state of the surface of the sample;

using a previously prepared reference image to detect a pattern similar to the reference image within the first two-dimensional image, and storing information on a position of the detected pattern as information on the position of the pattern to be inspected;

moving a measurement position from the position of the detected pattern by a predetermined distance in a predetermined direction to focus the charged particle beam;

moving the measurement position by the predetermined distance in a direction opposite to the predetermined direction to irradiate the charged particle beam, and acquiring a second two-dimensional image magnified higher than the first two-dimensional image to measure the detected pattern as a first measurement; and automatically moving the measurement position to an area other than an area on the sample to which the charged particle beam has been already irradiated to again carry out a measurement in the case of carrying out a remeasurement of the pattern to be inspected.

According to a second aspect of the present invention, there is provided a program which causes a pattern inspection method to be executed by a computer connected to a charged particle beam apparatus, the charged particle beam apparatus being equipped with: a charged particle beam source which generates a charged particle beam to irradiate the charged particle beam to a sample having a surface on which a pattern to be inspected is formed; a focal position adjuster which adjusts the focal position of the charged particle beam; a beam position controller which adjusts a positional relation between the sample and the charged particle beam so that the charged particle beam is irradiated to a desired position on the sample; a detector which detects at least one of a secondary charged particle, a reflection charged particle and a back scattering charged particle emitted from the sample due to the irradiation of the charged particle beam to output data on a two-dimensional image showing a state of the surface of the sample; and a pattern recognizer which detects the pattern to be inspected within the two-dimensional image, the pattern inspection method comprising:

generating a charged particle beam to irradiate the charged particle beam to a sample having a surface on which a pattern to be inspected is formed;

detecting at least one of a secondary charged particle, a reflection charged particle and a back scattering charged particle emitted from the sample due to the irradiation of the charged particle beam, and acquiring a first two-dimensional image showing a state of the surface of the sample;

using a previously prepared reference image to detect a pattern similar to the reference image within the first two-dimensional image, and storing information on a position of the detected pattern as information on the position of the pattern to be inspected;

moving a measurement position from the position of the detected pattern by a predetermined distance in a predetermined direction to focus the charged particle beam;

moving the measurement position by the predetermined distance in a direction opposite to the predetermined direction to irradiate the charged particle beam, and acquiring a second two-dimensional image magnified higher than the first two-dimensional image to measure the detected pattern as a first measurement; and automatically moving the measurement position to an area other than an area on the sample to which the charged particle beam has been already irradiated to again carry out a measurement in the case of carrying out a remeasurement of the pattern to be inspected.

According to a third aspect of the present invention, there is provided a semiconductor device manufacturing method comprising executing a process of manufacturing a semiconductor device on a substrate when a pattern to be inspected on the substrate for fabrication of the semiconductor device is judged to satisfy required specifications of the semiconductor device as a result of an inspection by a pattern inspection method, the pattern inspection method including:

generating a charged particle beam to irradiate the charged particle beam to a sample having a surface on which a pattern to be inspected is formed;

detecting at least one of a secondary charged particle, a reflection charged particle and a back scattering charged particle emitted from the sample due to the irradiation of the charged particle beam, and acquiring a first two-dimensional image showing a state of the surface of the sample;

using a previously prepared reference image to detect a pattern similar to the reference image within the first two-dimensional image, and storing information on a position of the detected pattern as information on the position of the pattern to be inspected;

moving a measurement position from the position of the detected pattern by a predetermined distance in a predetermined direction to focus the charged particle beam;

moving the measurement position by the predetermined distance in a direction opposite to the predetermined direction to irradiate the charged particle beam, and acquiring a second two-dimensional image magnified higher than the first two-dimensional image to measure the detected pattern as a first measurement; and automatically moving the measurement position to an area other than an area on the sample to which the charged particle beam has been already irradiated to again carry out a measurement in the case of carrying out a remeasurement of the pattern to be inspected.

According to a fourth aspect of the present invention, there is provided a pattern inspection apparatus comprising:

a charged particle beam source which generates a charged particle beam to irradiate the charged particle beam to a pattern to be inspected formed on a surface of a sample;

a focal position adjuster which adjusts the focal position of the charged particle beam;

a beam position controller which adjusts a positional relation between the sample and the charged particle beam so that the charged particle beam is irradiated to a desired position on the sample;

a detector which detects at least one of a secondary charged particle, a reflection charged particle and a back scattering charged particle emitted from the sample due to the irradiation of the charged particle beam to output data on a first two-dimensional image showing a state of the surface of the sample;

a pattern recognizer which uses a previously prepared reference image to detect a pattern similar to the reference image within the first two-dimensional image, and outputting information on the position of the detected pattern as information on the position of the pattern to be inspected; and a controller which controls the charged particle beam source, the focal position adjuster, the beam position controller, the detector and the pattern recognizer so that a measurement position is moved from the position of the detected pattern by a predetermined distance in a predetermined direction to focus the charged particle beam, the measurement position is then moved by the predetermined distance in a direction opposite to the predetermined direction to irradiate the charged particle beam, a second two-dimensional image magnified higher than the first two-dimensional image is acquired to measure the detected pattern, and then the measurement position is automatically moved to an area other than an area on the sample to which the charged particle beam has been already irradiated in the case of carrying out a remeasurement of the pattern to be inspected.

DETAILED DESCRIPTION OF THE INVENTION

Several embodiments of the present invention will hereinafter be described with reference to the drawings. It is to be noted that a case will be described below where an electron beam is used as a charged particle beam, but the present invention is not limited thereto and is also applicable to a case where, for example, an ion beam is used.

(1) Pattern Inspection Apparatus

Figure 1:
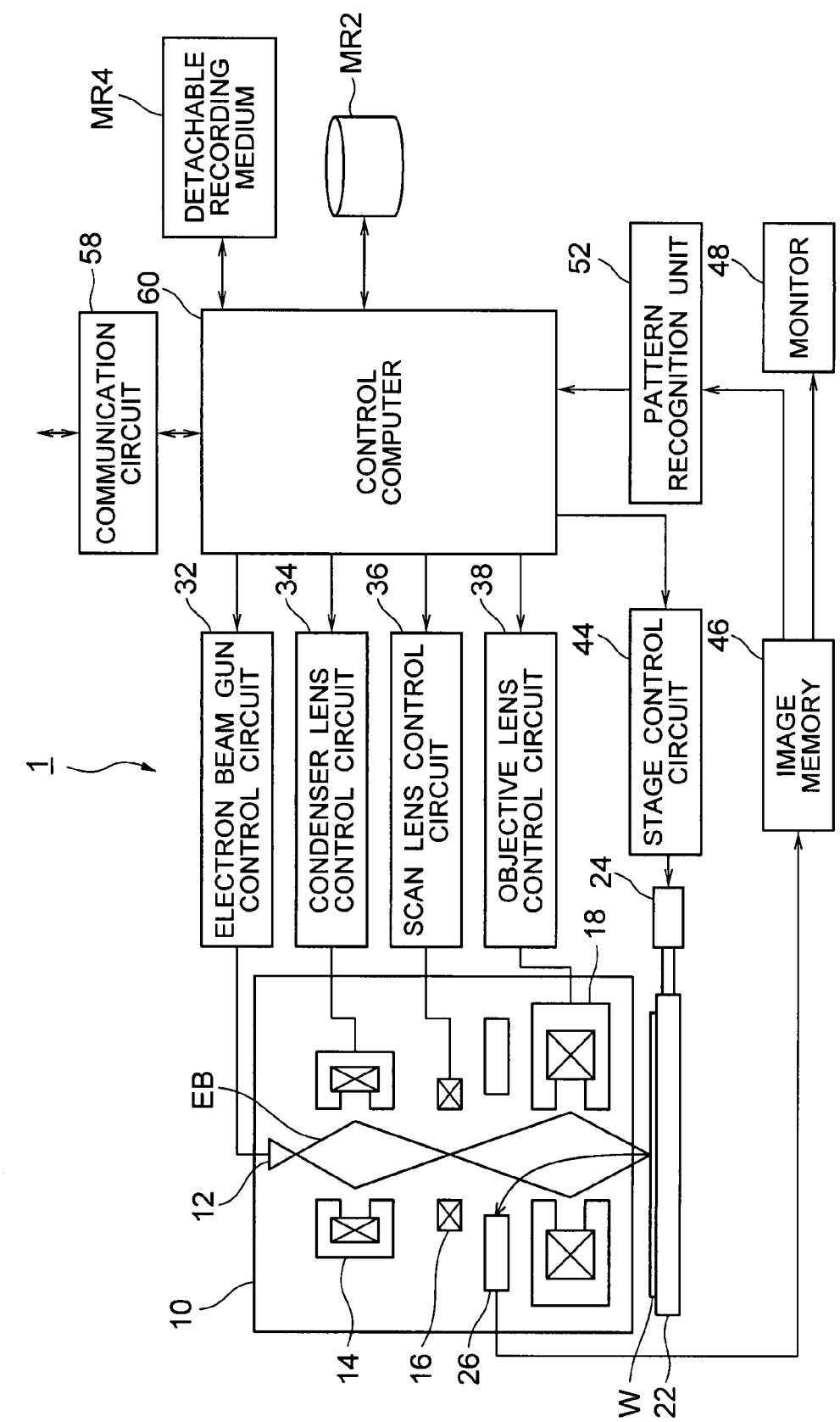
FIG. 1 is a block diagram showing a schematic configuration in one embodiment of a pattern inspection apparatus according to the present invention.

FIG. 1 is a block diagram showing a schematic configuration in one embodiment of a pattern inspection apparatus according to the present invention. A pattern inspection apparatus 1 shown in FIG. 1 is a scanning electron microscope which scans a semiconductor pattern with a converged electron beam EB to measure the dimensions of the semiconductor pattern.

The pattern inspection apparatus 1 comprises an electron beam column 10, various electron-optical system control circuits 32, 34, 36 and 38, an X-Y stage 22 for supporting a wafer W which is a sample having a pattern to be inspected formed therein, a motor 24, a stage control circuit 44, a detector 26, an image memory 46, a pattern recognition unit 52, a monitor 48, a control computer 60, a communication circuit 58, and various recording media MR2 and MR4 previously incorporated in or detachable from the apparatus.

The control computer 60 is connected to the various electron-optical system control circuits 32, 34, 36 and 38, the stage control circuit 44 and the pattern recognition unit 52 as well as the recording media MR2 and MR4, and the control computer 60 controls the whole apparatus via these circuits, etc., and carries out a pattern inspection described later on the basis of a recipe file stored in the recording medium MR2.

In the present embodiment, the recording media MR2 and MR4 respectively store the recipe file in which a series of procedures of a pattern inspection method described later is written, and a measurement condition file. These files are previously stored in these recording media, or can also be loaded for every measurement from an external recording medium or another apparatus via the communication circuit 58 connected to a private circuit or a public circuit and via the control computer 60, and then stored in the above-mentioned recording media.

The recording medium MR4 stores design data regarding the pattern to be inspected, and a reference image for pattern detection described later.

The electron beam column 10 includes an electron beam gun 12, a condenser lens 14, a scan lens 16 and an objective lens 18. The electron beam gun 12 is connected to the control computer 60 via the electron beam gun control circuit 32, and generates the electron beam EB in response to a control signal from the electron beam gun control circuit 32 and irradiates the wafer W with the electron beam EB. The condenser lens 14 is connected to the control computer 60 via the condenser lens control circuit 34, and excites a magnetic field or an electric field in response to a control signal from the condenser lens control circuit 34, and then converges the electron beam EB so that it has a proper beam diameter. The objective lens 18 is connected to the control computer 60 via the objective lens control circuit 38, and excites a magnetic field or an electric field in accordance with a control signal from the objective lens control circuit 38, and then again converges the electron beam EB so that the wafer W is irradiated with the electron beam in just focus. In the present embodiment, the objective lens 18 and the objective lens control circuit 38 correspond to, for example, a focal position adjuster. The scan lens 16 is connected to the control computer 60 via the scan lens control circuit 36, and excites an electric field or a magnetic field for deflecting the electron beam EB in response to a control signal from the scan lens control circuit 36, thereby two-dimensionally scanning the wafer W with the electron beam EB. The motor 24 is connected to the X-Y stage 22 and also connected to the control computer 60 via the stage control circuit 44, and the motor 24 operates in response to a control signal from the stage control circuit 44, and moves the X-Y stage 22 within an X-Y plane. In the present embodiment, the scan lens 16 and the scan lens control circuit 36 as well as the X-Y stage 22, the motor 24 and the stage control circuit 44 correspond to, for example, a beam position controller.

The detector 26 detects at least one of a secondary electron, a reflection electron and a back scattering electron generated from the wafer W by the irradiation of the electron beam EB. The detector 26 is connected to the image memory 46. Output signals of the detector 26 constitute a two-dimensional image showing the state of the surface of the wafer W, and data on this two-dimensional image is sent to and stored in the image memory 46.

The image memory 46 is connected to the pattern recognition unit 52 and the monitor 48. The two-dimensional image data from the detector 26 is output from the image memory 46 to the monitor 48 on which the two-dimensional image is displayed so that it serves in the observation of the surface of the wafer, and the two-dimensional image data is also output to the pattern recognition unit 52.

The pattern recognition unit 52 uses the reference image loaded and sent from the recording medium MR4 by the control computer 60 to carry out pattern recognition by comparison with the two-dimensional image supplied from the image memory 46, and supplies information on the position of the detected pattern to the control computer 60 when the pattern recognition is achieved.

The operation of the pattern inspection apparatus 1 shown in FIG. 1 will be described below as embodiments of the pattern inspection method according to the present invention.

(2) Pattern Inspection Method (i) First Embodiment

Figure 2:
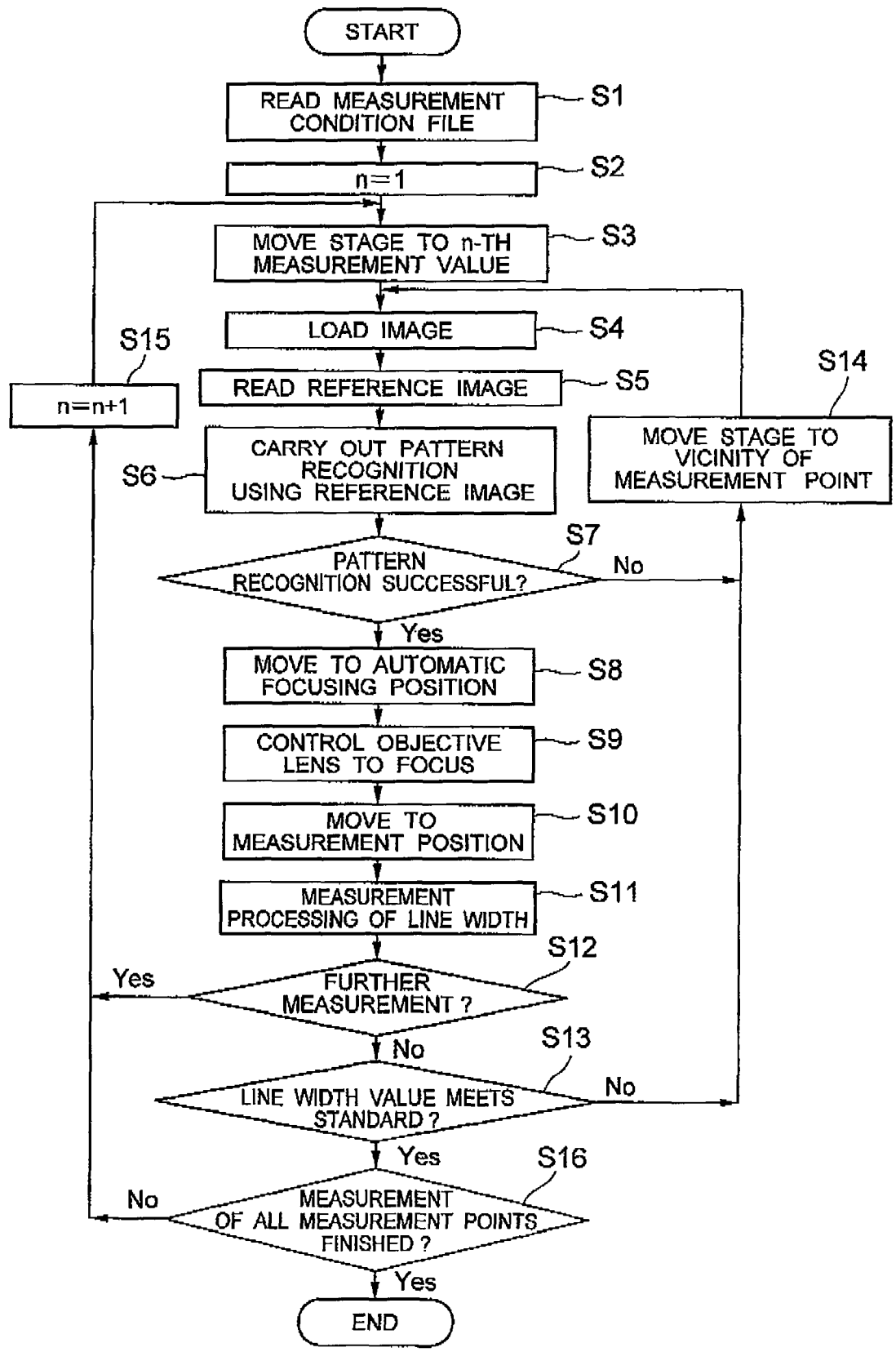
FIG. 2 is a flowchart showing schematic procedures in one embodiment of a pattern inspection method according to the present invention.
Figure 3:
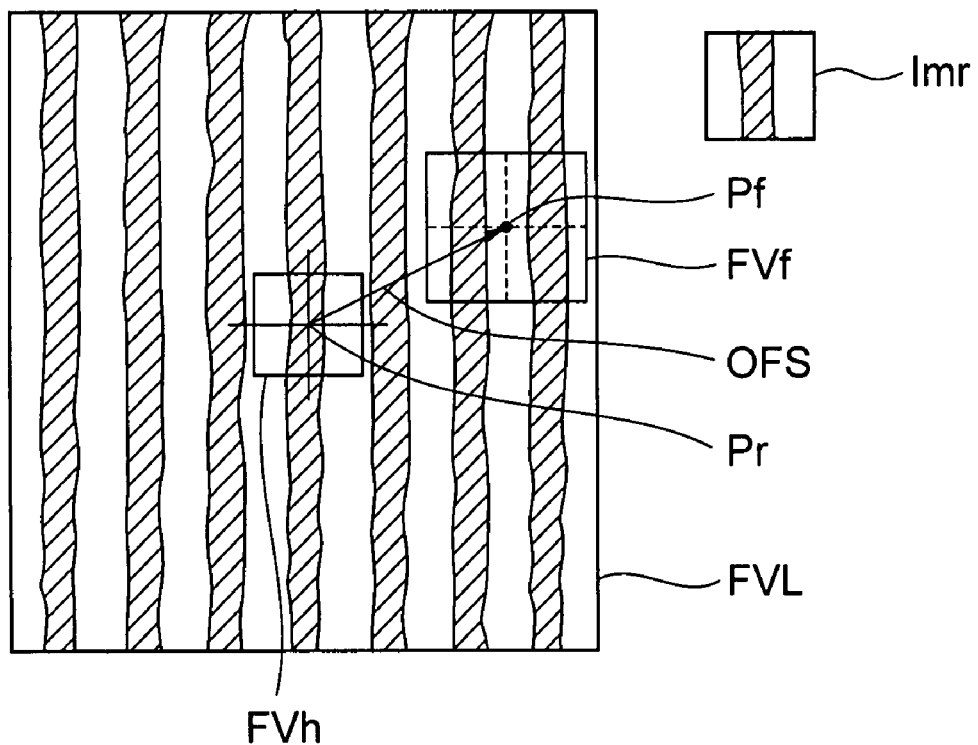
FIG. 3 is an explanatory diagram of automatic length measurement.

FIG. 2 is a flowchart showing schematic procedures in a first embodiment of the pattern inspection method according to the present invention, and FIG. 3 is an explanatory diagram of automatic length measurement. The present embodiment provides a method suitable for an inspection of a simple repetitive pattern such as a line-and-space pattern shown in FIG. 3.

First, a measurement condition file is read from recording media MR2 and MR4, from which measurement conditions are read, such as position coordinates of measurement points 1 to N (N is a whole number), a threshold value for acceptability judgment for use in pattern recognition, a reference image, and offsets (step 51).

Next, a count n of a counter (not shown) incorporated in a control computer 60 is set to 1 (step S2), an X-Y stage 22 is driven on the basis of information on the position of the read first measurement point, thereby moving a wafer W so that the first measurement point is positioned in the center of an observation field (step S3). An electron beam EB is irradiated at this position, and a two-dimensional image having a low magnification of, for example, 15 kX and an observation field of 10 μm is acquired and loaded into an image memory 46 (step S4). A two-dimensional image FVL shown in FIG. 3 is one example of the two-dimensional image obtained in this manner. This two-dimensional image corresponds to, for example, a first two-dimensional image in the present embodiment.

Since the accuracy in stopping the stage in a pattern inspection apparatus 1 shown in FIG. 1 is ±2 μm, it is impossible to precisely decide the measurement point and the position for performing automatic focusing only by the operation of the X-Y stage 22 conforming to step S3. Therefore, position search using the reference image is executed for the measurement point.

More specifically, for example, a reference image Imr shown in FIG. 3 is read (step S5), and a place Pr corresponding to the reference image Imr within the image FVL loaded earlier into the image memory 46 is searched for by a pattern recognition unit 52 (step S6). When there is the place Pr corresponding to the reference image Imr within the observation field, more specifically, when the level of correspondence of the patterns exceeds the threshold value, the pattern recognition is successful (step S7). In that case, an original point of the scanning with the electron beam EB by a scan lens 16 is then changed, and the electron beam EB is moved to a pattern for automatic focusing which is separated by a predetermined distance (an offset OFS in FIG. 3) in a predetermined direction from the place where the pattern recognition has been successful and which is located at a position Pf outside an observation field FVh (step S8), and then an exciting current of an objective lens 18 is controlled to carry out the automatic focusing within a field of view for automatic focusing FVf (step S9). The direction and amount (distance) of this offset OFS are preset as one of the measurement conditions. The measurement and focusing are carried out at different positions in this manner to prevent damages due to the irradiation of the electron beam EB from concentrating on one place. On the other hand, when the pattern recognition is unsuccessful, the X-Y stage 22 is driven to move the wafer W to a position in the vicinity of the current measurement point (step S14), thus shifting to a sequence for a further measurement described later.

When the automatic focusing is finished, the electron beam EB is moved from the above-mentioned position to a position for measurement Pr separated by the same distance as the above-mentioned predetermined distance in a direction opposite to the above-mentioned predetermined direction (step S10), and a high-magnification two-dimensional image is acquired to measure the line width of the pattern (step S11). In the present embodiment, the two-dimensional image at this point corresponds to, for example, a second two-dimensional image. The movement of the electron beam EB in the procedures in steps S8 and S10 is electrically controlled by a scan lens control circuit 36, and the movement is therefore possible with an accuracy of about 10 nm.

Next, whether the line width value meets a standard is judged to assess whether the measurement has been correctly carried out (step S13). If the line width value meets the standard, whether any measurement points to be measured remain is judged (step S16). When there still remain points to be measured, the count of a counter (not shown) is only incremented by one (step S15), thus returning to step S3 to repeat the operations described above.

On the other hand, when the line width value does not meet the standard, it is presumed that an error has occurred in the procedure of at least one of the judgment of the acceptance of the pattern recognition (step S7), the movement processing of the electron beam EB (steps S8 and S10), the automatic focusing processing (step S9), and the line width measurement processing (step S11). Thus, the processing for moving the measurement point (step S14) is passed through to shift to the further measurement sequence.

Figure 4:
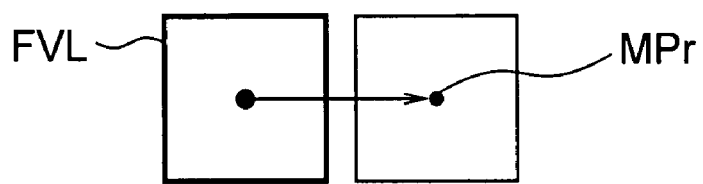
FIG. 4 is a diagram explaining the movement of a field of view to the vicinity of a measurement point.

The sequence for the further measurement will be described with reference to FIG. 4 as well. When the further measurement is carried out, the redundant irradiation of the electron beam EB has to be avoided. Therefore, as shown in FIG. 4, there is decided a range which has been irradiated with the electron beam EB in the first measurement, that is, a position MPr for the further measurement outside the field of view in which the two-dimensional image FVL has been acquired with low magnification. When the line width value does not meet the standard as a result of the further measurement, it is presumed that the dimensions of the pattern to be inspected as such do not meet the standard, without any error in one of the judgment of the acceptance of the pattern recognition (step S7), the movement processing of the electron beam EB (steps S8 and S10), the automatic focusing processing (step S9), and the line width measurement processing (step S11). Therefore, in the case of the further measurement (step S12), whether the line width value meets the standard is not judged, thus moving to the procedure in step S15 for incrementing the count of the counter (not shown). It is to be noted that the further measurement is carried out up to one time in the present embodiment, but the further measurement may be carried out any number of times as long as measurement time allows.

Thus, according to the present embodiment, the measurement position is automatically moved to the outside of the area to which the charged particle beam has already been irradiated, even when the further measurement is needed due to, for example, an error, such that it is possible to minimize the change in the shape of the pattern due to the charged particle beam and accurately measure the pattern targeted for measurement.

(ii) Second Embodiment

The present embodiment provides an inspection method suitable for the measurement of a particular place in a random pattern such as a logic circuit. When a pattern to be inspected is a random pattern, a further measurement point may be anywhere as long as it is outside a range which has been irradiated with an electron beam in the first measurement, and the pattern has to have the same shape as that of the pattern for which the first measurement has been carried out. Thus, in the present embodiment, a plurality of positions for the further measurement are decided in advance on the basis of design data for the pattern to be inspected, and incorporated in a measurement recipe as candidates for the further measurement point. This makes it possible to achieve an accurate measurement with a minimum change in the pattern shape due to a charged particle beam even if the pattern to be inspected is a complicated pattern. A further measurement point is selected from these candidates at the time of the further measurement. These candidates may be automatically decided using a technique of pattern recognition, or may be decided by an operator on the basis of the design data.

(iii) Third Embodiment

The position of a remeasurement further measurement point is decided in advance on the basis of design data in the second embodiment described above, but the present invention is not limited thereto, and the technique of pattern recognition described above may be used so that the periphery of a first measurement point may be searched as a remeasurement further measurement point every time remeasurement further measurement is needed.

(4) Program

A series of procedures of the pattern inspection method described above may be may be stored, for example, in the form of the above-mentioned recipe file in a recording medium such as a flexible disk or a CD-ROM as a program to be executed by a computer, and may be read into and executed by the computer. This makes it possible to achieve the pattern inspection method according to the present invention by use of a control computer connected to a scanning electron microscope. The recording medium is not limited to a portable medium such as a magnetic disk or an optical disk, and may be a fixed recording medium such as a hard disk drive or a memory. Further, the program incorporating the series of procedures of the pattern inspection method described above may be distributed via a communication line (including wireless communication) such as the Internet. Moreover, the program incorporating the series of procedures of the pattern inspection method described above may be distributed in an encrypted, modulated or compressed state via a wired line such as the Internet or a wireless line or in a manner stored in a recording medium.

(5) Semiconductor Device Manufacturing Method

If the pattern inspection method in the embodiments described above is used in a process of manufacturing a semiconductor device, the movement of a measurement position to the outside of an area which has been already irradiated with a charged particle beam can be automatically made without depending on the level of skill of an operator, and the problem of a change in the pattern shape due to the re-irradiation of the charged particle beam is solved, such that it is possible to rapidly and accurately measure the pattern to be inspected for fabrication of the semiconductor device on a substrate. This enables, for example, a dimensional measurement with high accuracy and at a high speed, so that it is possible to manufacture a semiconductor device with a high throughput and a high yield if the above-mentioned process of manufacturing the semiconductor device on the substrate is executed when it is judged that required specifications of products are satisfied as a result of the pattern inspection described above.

What is claimed is:

1. A pattern inspection method comprising:
measuring a pattern to be inspected, including:
irradiating with a charged particle beam a first region of a surface of a sample having the pattern to be inspected formed therein,
acquiring a first two-dimensional image showing a state of the surface of the sample by detecting at least one of a secondary charged particle, a reflection charged particle, and a back scattering charged particle emitted from the sample due to the irradiation of the first region with the charged particle beam,
searching, within the first two-dimensional image, for a first pattern similar to a previously prepared reference image, and
when the first pattern similar to the reference image is detected at a first place within the first two-dimensional image, focusing the charged particle beam at a second place that is different from the first place, acquiring a second two-dimensional image magnified higher than the first two-dimensional image at the first place; and
further measuring the pattern to be inspected when the first pattern similar to the reference image is not detected in the first two-dimensional image, the further measuring including:
irradiating with the charged particle beam a second region of the surface of the sample that has not been irradiated,
acquiring a third two-dimensional image showing a state of the surface of the sample by detecting at least one of a secondary charged particle, a reflection charged particle, and a back scattering charged particle emitted from the sample due to the irradiation of the second region with the charged particle beam,
searching, within the third two-dimensional image, for a second pattern similar to the reference image,
when the second pattern similar to the reference image is detected at a third place within the third two-dimensional image, focusing the charged particle beam at a fourth place that is different from the third place, acquiring a fourth two-dimensional image magnified higher than the third two-dimensional image at the third place.

2. The pattern inspection method according to claim 1, further comprising:
previously deciding a plurality of candidates as measurement positions for the further measuring on the basis of design data for the pattern to be inspected,
the second region being selected from the plurality of candidates.

3. The pattern inspection method according to claim 1, wherein the second region is located in the vicinity of the first region.

4. The pattern inspection method according to claim 1, further comprising:
judging whether a line width value obtained as a result of the detecting the first pattern similar to the reference image meets a preset standard, wherein the further measuring is performed when the line width value does not meet the preset standard.

5. A semiconductor device manufacturing method comprising executing a process of manufacturing a semiconductor device on a substrate when a pattern to be inspected on the substrate for fabrication of the semiconductor device is judged to satisfy required specifications of the semiconductor device as a result of an inspection by a pattern inspection method, the pattern inspection method comprising:
measuring a pattern to be inspected, including:
irradiating with a charged particle beam a first region of a surface of a sample having the pattern to be inspected formed therein,
acquiring a first two-dimensional image showing a state of the surface of the sample by detecting at least one of a secondary charged particle, a reflection charged particle, and a back scattering charged particle emitted from the sample due to the irradiation of the first region with the charged particle beam,
searching, within the first two-dimensional image, for a first pattern similar to a previously prepared reference image, and
when the first pattern similar to the reference image is detected at a first place within the first two-dimensional image, focusing the charged particle beam at a second place that is different from the first place, acquiring a second two-dimensional image magnified higher than the first two-dimensional image at the first place; and
further measuring the pattern to be inspected when the first pattern similar to the reference image is not detected in the first two-dimensional image, the further measuring including:
irradiating with the charged particle beam a second region of the surface of the sample that has not been irradiated,
acquiring a third two-dimensional image showing a state of the surface of the sample by detecting at least one of a secondary charged particle, a reflection charged particle, and a back scattering charged particle emitted from the sample due to the irradiation of the second region with the charged particle beam,
searching, within the third two-dimensional image, for a second pattern similar to the reference image,
when the second pattern similar to the reference image is detected at a third place within the third two-dimensional image, focusing the charged particle beam at a fourth place that is different from the third place, acquiring a fourth two-dimensional image magnified higher than the third two-dimensional image at the third place.

6. The semiconductor device manufacturing method according to claim 5, wherein the pattern inspection method further comprises previously deciding a plurality of candidates as measurement positions for the further measuring on the basis of design data for the pattern to be inspected, the second region being selected from the plurality of candidates.

7. The semiconductor device manufacturing method according to claim 5, wherein the second region is located in the vicinity of the first region.

8. The semiconductor device manufacturing method according to claim 5, wherein the pattern inspection method further comprises:
judging whether a line width value obtained as a result of the detecting the first pattern similar to the reference image at a first place meets a preset standard, wherein the further measuring is performed when the line width value does not meet the preset standard.

9. A pattern inspection apparatus comprising:
a charged particle beam source which generates a charged particle beam to irradiate a surface of a sample having a pattern to be inspected formed thereon;
a focal position adjuster which adjusts the focal position of the charged particle beam;

a beam position controller which adjusts a positional relation between the sample and the charged particle beam in a manner that a desired position on the sample is irradiated with the charged particle beam;

a detector which detects at least one of a secondary charged particle, a reflection charged particle and a back scattering charged particle emitted from the sample due to the irradiation of the surface of the sample with the charged particle beam to output data on a first two-dimensional image showing a state of the surface of the sample;

a pattern recognizer which uses a previously prepared reference image to detect a pattern similar to the reference image within the first two-dimensional image, and outputting information on the position of the detected pattern as information on the position of the pattern to be inspected; and a controller which performs an initial measurement of the pattern to be inspected in a first region of the surface of the sample and performs a further measurement when no pattern similar to a previously prepared reference image is detected within a first two-dimensional image of the first region of the surface of the sample, wherein in the initial measurement the controller: controls the charged particle beam source to irradiate with the charged particle beam the first region of the surface of the sample, to acquire a first two-dimensional image showing a state of the first region of the surface of the sample based on data from the detector; controls the pattern recognizer to search within the first two-dimensional image for a first pattern similar to the reference image; when the first pattern similar to the reference image is detected by the pattern recognizer at a first place within the first two-dimensional image, controls the beam position controller and the focal position adjuster to focus the charged particle beam at a second place that is different from the first place; controls the beam position controller, the charged particle source, and the detector to acquire a second two-dimensional image magnified higher than the first two-dimensional image at the first place and to measure the pattern to be inspected, and wherein in the further measurement the controller: controls the charged particle beam source to irradiate with the charged particle beam a second region of the surface of the sample that has not been irradiated, acquiring a third two-dimensional image showing a state of the second region of the surface of the sample based on data from the detector; controls the pattern recognizer to search within the third two-dimensional image for a second pattern similar to the reference image; when the second pattern similar to the reference image is detected by the pattern recognizer at a third place in the third two-dimensional image, controls the beam position controller and the focal position adjuster to focus the charged particle beam at a fourth place that is different from the third place; controls the beam position controller, the charged particle source, and the detector to acquire a fourth two-dimensional image magnified higher than the third two-dimensional image at the third place back from the fourth place and to measure the pattern to be inspected.

10. The pattern inspection apparatus according to claim 9, wherein the controller previously decides a plurality of candidates as measurement positions for the further measuring on the basis of design data for the pattern to be inspected, and selects the second region from the plurality of candidates.

11. The pattern inspection apparatus according to claim 9, wherein the second region is located in the vicinity of the first region.

12. The pattern inspection apparatus according to claim 9, wherein the controller judges whether a line width value obtained as a result of the detecting the first pattern similar to the reference image within the first two-dimensional image meets a preset standard, and carries out the further measuring when the line width value does not meet the preset standard.

* * * * *